(12) United States Patent
Noto et al.

(10) Patent No.: US 10,271,427 B2
(45) Date of Patent: Apr. 23, 2019

(54) PRINTED WIRING BOARD

(71) Applicant: IBIDEN CO., LTD., Ogaki-shi (JP)

(72) Inventors: Hiroyasu Noto, Ogaki (JP); Yoshinori Takenaka, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 4 days.

(21) Appl. No.: 15/704,222

(22) Filed: Sep. 14, 2017

(65) Prior Publication Data

US 2018/0084641 A1    Mar. 22, 2018

(30) Foreign Application Priority Data

Sep. 16, 2016  (JP) ................................ 2016-181504

(51) Int. Cl.

| | | |
|---|---|---|
| *H01F 27/245* | (2006.01) | |
| *H01F 27/28* | (2006.01) | |
| *H05K 1/02* | (2006.01) | |
| *H05K 1/03* | (2006.01) | |
| *H05K 3/46* | (2006.01) | |

(52) U.S. Cl.
CPC ......... *H05K 1/0306* (2013.01); *H01F 27/245* (2013.01); *H01F 27/2804* (2013.01); *H05K 3/46* (2013.01); *H01F 2027/2809* (2013.01); *H01L 2924/0002* (2013.01); *H05K 1/0271* (2013.01)

(58) Field of Classification Search
USPC .............. 174/256; 257/772; 438/113; 29/846
See application file for complete search history.

(56) References Cited

U.S. PATENT DOCUMENTS

| | | | | |
|---|---|---|---|---|
| 2011/0120754 A1* | 5/2011 | Kondo | ................... | H01L 23/14 174/254 |
| 2011/0314669 A1* | 12/2011 | Stamper | .............. | B81C 1/00365 29/846 |
| 2012/0055015 A1* | 3/2012 | Toyoda | ................... | H01L 21/56 29/829 |
| 2012/0124829 A1* | 5/2012 | Kamei | .................. | G11B 5/486 29/846 |
| 2013/0015582 A1* | 1/2013 | Kondo | .............. | H01L 23/49816 257/772 |

FOREIGN PATENT DOCUMENTS

JP       2012-231053 A       11/2012

* cited by examiner

*Primary Examiner* — Timothy J Thompson
*Assistant Examiner* — Guillermo J Egoavil
(74) *Attorney, Agent, or Firm* — Oblon, McClelland, Maier & Neustadt, L.L.P.

(57) ABSTRACT

A printed wiring board includes a first conductor layer including a first conductor circuit and a second conductor circuit formed adjacent to the first circuit, a resin insulating layer formed on the first conductor layer such that the insulating layer is filling space between the first and second conductor circuits, and a second conductor layer formed on the insulating layer such that distance (T) between the first and second conductor layers is in the range of 4.5 μm to 10.5 μm. The resin insulating layer includes inorganic particles having average particle diameter (D1) such that ratio (D1/S) of the diameter (D1) to distance (S) of the space is less than 0.25 and that ratio (D1/T) of the diameter (D1) to the distance (T) is less than 0.25, where the distance (S) of the space between the first and second conductor circuits is in the range of 4.5 μm to 10.5.

20 Claims, 2 Drawing Sheets

PRINTED WIRING BOARD

CROSS-REFERENCE TO RELATED APPLICATIONS

The present application is based upon and claims the benefit of priority to Japanese Patent Application No. 2016-181504, filed Sep. 16, 2016, the entire contents of which are incorporated herein by reference.

BACKGROUND OF THE INVENTION

Field of the Invention

The present invention relates to a printed wiring board having a resin insulating layer that contains inorganic particles.

Description of Background Art

Japanese Patent Laid-Open Publication No. 2012-231053 describes a multilayer substrate. The multilayer substrate includes an insulating layer, wiring patterns that are formed on both sides of the insulating layer, and a conductive resin composition that connects the wiring patterns on the both sides. The insulating layer contains an insulating filler. The entire contents of this publication are incorporated herein by reference.

SUMMARY OF THE INVENTION

According to one aspect of the present invention, a printed wiring board includes a first conductor layer including a first conductor circuit and a second conductor circuit formed adjacent to the first conductor circuit, a resin insulating layer formed on the first conductor layer such that the resin insulating layer is filling a space between the first conductor circuit and the second conductor circuit, and a second conductor layer formed on the resin insulating layer such that a distance (T) between the first conductor layer and the second conductor layer is in the range of 4.5 μm to 10.5 μm. The resin insulating layer includes inorganic particles having an average particle diameter (D1) such that a ratio (D1/S) of the diameter (D1) to a distance (S) of the space is less than 0.25 and that a ratio (D1/T) of the diameter (D1) to the distance (T) is less than 0.25, where the distance (S) of the space between the first conductor circuit and the second conductor circuit is in the range of 4.5 μm to 10.5.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
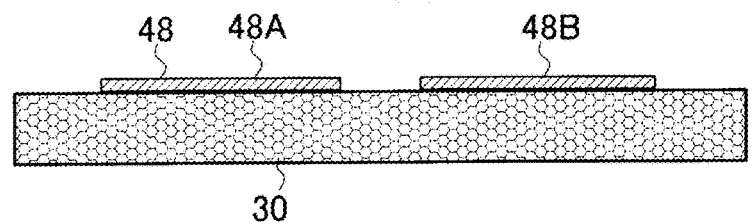
FIG. 1A-1D are manufacturing process diagrams of a printed wiring board according to an embodiment of the present invention.

Embodiments will now be described with reference to the accompanying drawings, wherein like reference numerals designate corresponding or identical elements throughout the various drawings.

Figure 1B:
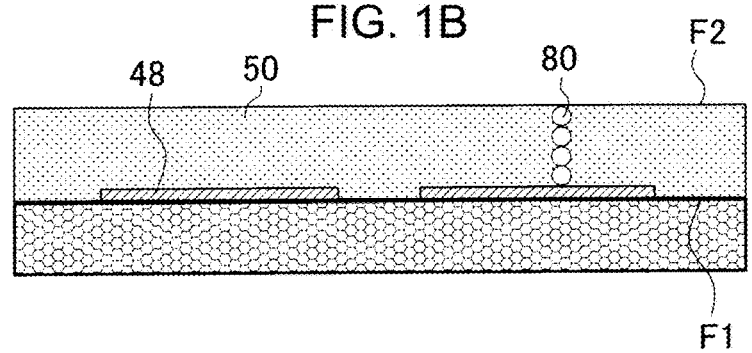
Figure 1C:
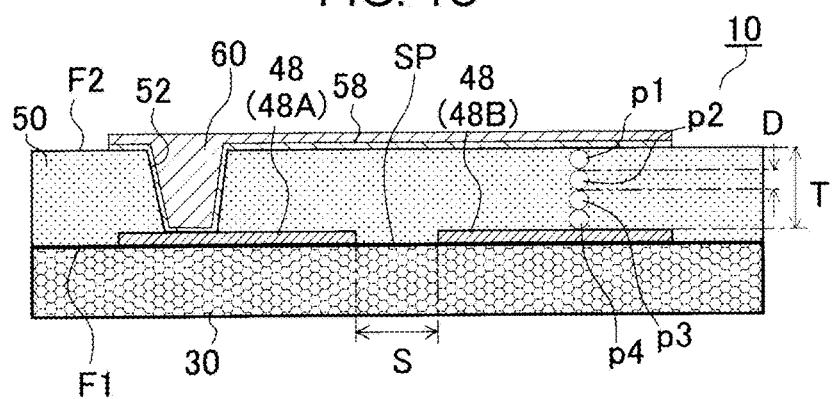

FIG. 1C illustrates a printed wiring board 10 of an embodiment.

The printed wiring board 10 includes: a resin insulating layer 50 that has a first surface (F1) and a second surface (F2) that is on an opposite side of the first surface (F1); a first conductor layer 48 and a second conductor layer 58 that sandwich the resin insulating layer 50; and a via conductor 60 that penetrates the resin insulating layer 50 and connects the first conductor layer 48 and the second conductor layer 58 to each other.

The first conductor layer 48 is formed on the first surface (F1) and is embedded in the resin insulating layer 50. Further, the first conductor layer 48 includes a first conductor circuit (48A), and a second conductor circuit (48B) adjacent to the first conductor circuit (48A). There is a space (SP) between the first conductor circuit (48A) and the second conductor circuit (48B). The space (SP) is filled with the resin insulating layer 50. A distance between the first conductor circuit (48A) and the second conductor circuit (48B) is a distance (S) of the space (SP).

The second conductor layer 58 is formed on the second surface (F2), and protrudes from the second surface (F2).

A distance between the first conductor layer 48 and the second conductor layer 58 is a thickness (T) of the resin insulating layer 50.

The resin insulating layer 50 is formed of inorganic particles 80 and resin. The resin insulating layer 50 may contain a curing agent as an additive. However, the resin insulating layer 50 does not contain a reinforcing material formed of fibers. Examples of the reinforcing material include a glass cloth, glass fibers and resin fibers. The resin insulating layer 50 preferably dos not contain a reinforcing material other than the spherical inorganic particles 80.

An average particle diameter (D1) of the inorganic particles contained in the resin insulating layer 50 is preferably 0.05 μm or more and 1 μm or less. Among the multiple inorganic particles, a largest inorganic particle has a diameter (maximum particle diameter) (D2) of 1.8 μm or less. A content of the inorganic particles contained in the resin insulating layer 50 is 35 w % or more and 75 w % or less.

The thickness (T) of the resin insulating layer 50 is 4.5 μm or more and 10.5 μm or less. Here, the thickness (T) of the resin insulating layer 50 is an insulation interval (T) of the resin insulating layer 50.

The distance (insulation distance) (S) of the space (SP) is 4.5 μm or more and 10.5 μm or less.

Figure 2A:
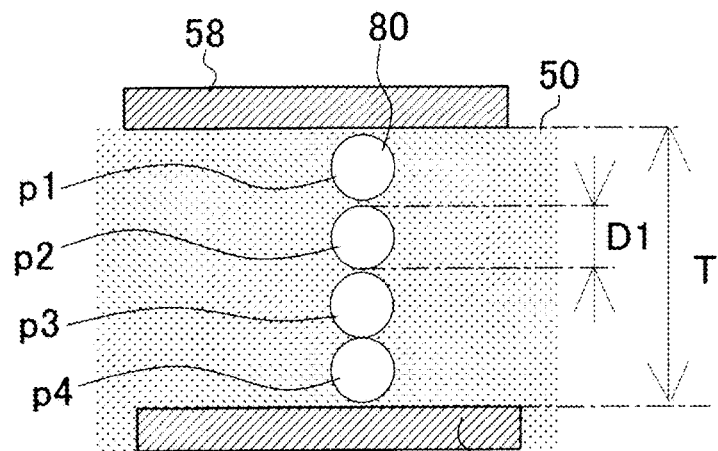
FIG. 2A is a cross-sectional view of the printed wiring board according to the embodiment.

A ratio (D1/T) of the average particle diameter (D1) to the insulation interval (T) is less than 0.25 (¼). An enlarged view of a portion of FIG. 1C is illustrated in FIG. 2A. When the ratio (D1/T) is less than 0.25, as illustrated in FIG. 2A, even when four inorganic particles (p1, p2, p3, p4) are vertically aligned, there is likely to be a gap between the second conductor layer 58 and the inorganic particle (p1). There is likely to be a gap between the inorganic particle (p1) and the inorganic particle (p2). There is likely to be a gap between the inorganic particle (p2) and the inorganic particle (p3). There is likely to be a gap between the inorganic particle (p3) and the inorganic particle (p4). There is likely to be a gap between the inorganic particle (p4) and the first conductor layer 48. Resin is likely to exist in the gaps. Therefore, migration via surfaces of the inorganic particles can be suppressed. Therefore, even when the thickness (T) is small, when the ratio (D1/T) is less than 0.25, insulation reliability between the first conductor layer 48 and the second conductor layer 58 can be increased. The ratio (D1/T) is preferably 0.1 or more.

A ratio (D2/T) of the maximum particle diameter (D2) to the insulation interval (T) is preferably less than 0.25 (¼). Even when four large inorganic particles are vertically aligned, a short circuit between the first conductor layer 48 and the second conductor layer 58 due to migration is unlikely to occur.

Figure 1D:
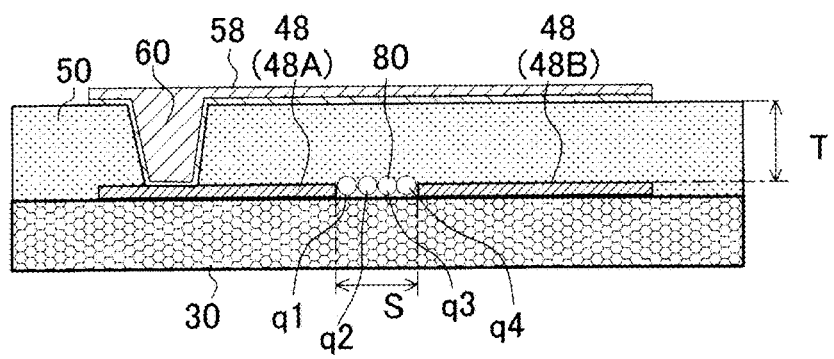
Figure 2B:
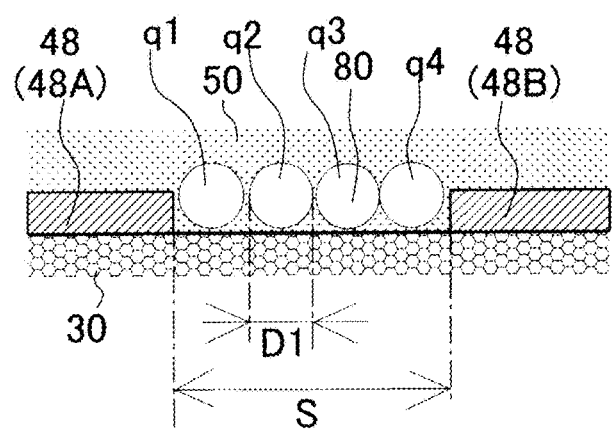
FIG. 2B is another cross-sectional view of the printed wiring board according to the embodiment.

A ratio (D1/S) of the average particle diameter (D1) to the insulation distance (S) is less than 0.25 (¼). An enlarged view of a portion of FIG. 1D is illustrated in FIG. 2B. When the ratio (D1/S) is less than 0.25, as illustrated in FIG. 2B, even when four inorganic particles (q1, q2, q3, q4) are horizontally aligned, there is likely to be a gap between the first conductor circuit (48A) and the inorganic particle (q1). There is likely to be a gap between the inorganic particle (q1) and the inorganic particle (q2). There is likely to be a gap between the inorganic particle (q2) and the inorganic particle (q3). There is likely to be a gap between the inorganic particle (q3) and the inorganic particle (q4). There is likely to be a gap between the inorganic particle (q4) and the second conductor circuit (48B). Resin is likely to exist in the gaps. Therefore, migration via surfaces of the inorganic particles can be suppressed. Therefore, even when the insulation distance (S) is small, insulation reliability between the first conductor circuit (48A) and the second conductor circuit (48B) can be increased. The ratio (D1/S) is preferably 0.1 or more. The space (SP) is easily filled with the resin insulating layer 50.

A ratio (D2/S) of the maximum particle diameter (D2) to the insulation distance (S) is preferably less than 0.25 (¼). Even when four large inorganic particles are horizontally aligned, a short circuit between the first conductor circuit (48A) and the second conductor circuit (48B) due to migration is unlikely to occur.

FIG. 1A-1D illustrate a method for manufacturing the printed wiring board 10 according to the embodiment.

The first conductor layer 48 including the first conductor circuit (48A) and the second conductor circuit (48B) is formed on a substrate 30 (FIG. 1A). The resin insulating layer 50 having the first surface (F1) and the second surface (F2) is laminated on the substrate 30 and on the first conductor layer 48 (FIG. 1B). In this case, the space (SP) between the first conductor circuit (48A) and the second conductor circuit (48B) is filled with the resin insulating layer 50. The first conductor layer 48 is embedded in the first resin insulating layer 50. The first conductor layer 48 is positioned on the first surface (F1). The resin insulating layer 50 contains an epoxy resin and the inorganic particles 80. The content of the inorganic particles 80 in the resin insulating layer 50 is, for example, 35 wt. % or more and 75 wt. % or less. Examples of the inorganic particles 80 include silica particles and alumina particles. For example, the maximum particle diameter (D2) of the inorganic particles is 1.12 μm or more and 1.8 μm or less. The inorganic particles 80 preferably have spherical shapes.

An opening 52 is formed in the resin insulating layer 50 using CO2 laser. Thereafter, the second conductor layer 58 is formed on the second surface (F2) of the resin insulating layer 50 using a semi-additive method. At the same time, the via conductor 60 that connects the first conductor layer 48 and the second conductor layer 58 is formed in the opening 52 (FIG. 1C).

Figure 2C:
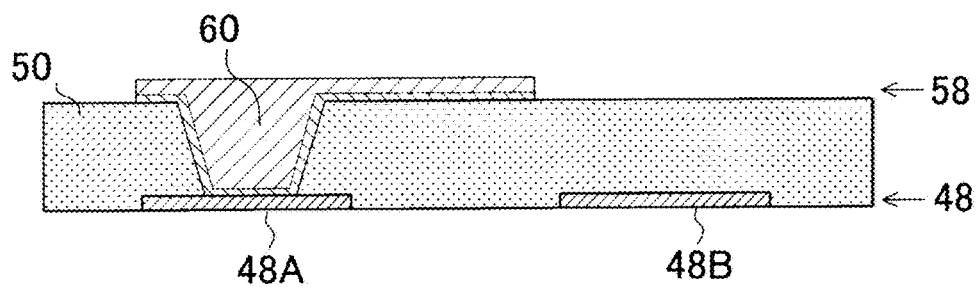
FIG. 2C is a cross-sectional view of a printed wiring board of another example.

The substrate 30 may be a circuit substrate having a conductor layer, a resin insulating layer and a via conductor. Or, the substrate 30 may be a carrier for forming the printed wiring board 10. When the substrate 30 is a carrier, the carrier is removed, and the printed wiring board 10 (printed wiring board of another example) illustrated in FIG. 2C is obtained.

When an insulating layer contains a coupling agent, insulation performance of the insulating layer can be increased. However, when a thickness of the insulating layer is small, it is difficult to increase the insulation performance of the insulating layer by only mixing the coupling agent in the insulating layer.

A printed wiring board according to an embodiment of the present invention includes: a first conductor layer that includes a first conductor circuit and a second conductor circuit that is adjacent to the first conductor circuit; a resin insulating layer that fills a space between the first conductor circuit and the second conductor circuit, and is formed on the first conductor layer; and a second conductor layer that is formed on the resin insulating layer. The resin insulating layer contains inorganic particles having an average particle diameter (D1). A distance (S) of the space is 4.5 μm or more and 10.5 μm or less. A distance (T) between the first conductor layer and the second conductor layer is 4.5 μm or more and 10.5 μm or less. A ratio (D1/S) of the diameter (D1) to the distance (S) is less than 0.25. A ratio (D1/T) of the diameter (D1) to the distance (T) is less than 0.25.

According to an embodiment of the present invention, even when the thickness of the resin insulating layer containing the inorganic particles is small, a printed wiring board having high insulation reliability can be provided. Even when a space between adjacent conductor circuits is small, a printed wiring board having high insulation reliability can be provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a first conductor layer comprising a first conductor circuit and a second conductor circuit forming adjacent to the first conductor circuit;
   a resin insulating layer formed on the first conductor layer such that the resin insulating layer is filling a space between the first conductor circuit and the second conductor circuit; and
   a second conductor layer formed on the resin insulating layer such that a distance T between the first conductor layer and the second conductor layer is in a range of 4.5 μm to 10.5 μm,
   wherein the resin insulating layer does not contain reinforcing material comprising fibers and comprises inorganic particles having an average particle diameter D1 such that a ratio D1/S of the diameter D1 to a distance S of the space is less than 0.25 and that a ratio D1/T of the diameter D1 to the distance T is less than 0.25, where the distance S of the space between the first conductor circuit and the second conductor circuit is in a range of 4.5 μm to 10.5.

2. A printed wiring board according to claim 1, wherein the inorganic particles have a maximum diameter D2 such that a ratio D2/S of the maximum diameter D2 to the distance S of the space is less than 0.25 and that a ratio D2/T of the maximum diameter D2 to the distance T is less than 0.25.

3. A printed wiring board according to claim 1, wherein the inorganic particles are silica particles.

4. A printed wiring board according to claim 1, wherein the resin insulating layer comprises the inorganic particles in a content of 35 wt. % to 75 wt. %.

5. A printed wiring board according to claim 2, wherein the inorganic particles are silica particles.

6. A printed wiring board according to claim 2, wherein the resin insulating layer comprises the inorganic particles in a content of 35 wt. % to 75 wt. %.

7. A printed wiring board according to claim 3, wherein the resin insulating layer comprises the inorganic particles in a content of 35 wt. % to 75 wt. %.

8. A printed wiring board according to claim 1, wherein the inorganic particles have a maximum diameter D2 of 1.8 μm or less.

9. A printed wiring board according to claim 1, wherein the inorganic particles have a maximum diameter D2 in a range of 1.12 μm to 1.8 μm.

10. A printed wiring board according to claim 2, wherein the inorganic particles have the maximum diameter D2 of 1.8 μm or less.

11. A printed wiring board according to claim 2, wherein the inorganic particles have the maximum diameter D2 in a range of 1.12 μm to 1.8 μm.

12. A printed wiring board according to claim 1, wherein the resin insulating layer comprises an epoxy resin and the inorganic particles in a content of 35 wt. % to 75 wt. %.

13. A printed wiring board according to claim 2, wherein the resin insulating layer comprises an epoxy resin and the inorganic particles in a content of 35 wt. % to 75 wt. %.

14. A printed wiring board according to claim 1, wherein the resin insulating layer comprises the inorganic particles having the average particle diameter D1 of 1 μm or less.

15. A printed wiring board according to claim 1, wherein the resin insulating layer comprises the inorganic particles having the average particle diameter D1 in a range of 0.05 μm to 1 μm.

16. A printed wiring board according to claim 2, wherein the resin insulating layer comprises the inorganic particles having the average particle diameter D1 of 1 μm or less.

17. A printed wiring board according to claim 2, wherein the resin insulating layer comprises the inorganic particles having the average particle diameter D1 in a range of 0.05 μm to 1 μm.

18. A printed wiring board according to claim 4, wherein the inorganic particles have a maximum diameter D2 of 1.8 μm or less.

19. A printed wiring board according to claim 4, wherein the inorganic particles have a maximum diameter D2 in a range of 1.12 μm to 1.8 μm.

20. A printed wiring board according to claim 4, wherein the inorganic particles have the average particle diameter D1 in a range of 0.05 μm to 1 μm and a maximum diameter D2 in a range of 1.12 μm to 1.8 μm.

* * * * *